United States Patent
Ngo et al.

(10) Patent No.: US 8,614,475 B2
(45) Date of Patent: Dec. 24, 2013

(54) VOID FREE INTERLAYER DIELECTRIC

(71) Applicants: Spansion LLC, Sunnyvale, CA (US); Advanced Micro Devices, Inc., Sunnyvale, CA (US)

(72) Inventors: Minh Van Ngo, Fremont, CA (US); Hirokazu Tokuno, Cupertino, CA (US); Angela T. Hui, Fremont, CA (US); Wenmei Li, Sunnyvale, CA (US); Hsiao-Han Thio, Santa Clara, CA (US)

(73) Assignees: Spansion LLC, Sunnyvale, CA (US); Advanced Mirco Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/732,096

(22) Filed: Dec. 31, 2012

(65) Prior Publication Data
US 2013/0140720 A1    Jun. 6, 2013

Related U.S. Application Data

(63) Continuation of application No. 11/109,719, filed on Apr. 20, 2005, now Pat. No. 8,367,493.

(51) Int. Cl.
*H01L 29/788* (2006.01)

(52) U.S. Cl.
USPC ........... 257/315; 257/314; 257/316; 257/333; 257/790; 438/275; 438/595

(58) Field of Classification Search
USPC .................. 257/314–316, 333, 790, E29.125, 257/E29.134; 438/275, 595
See application file for complete search history.

(56) References Cited

U.S. PATENT DOCUMENTS

| | | | |
|---|---|---|---|
| 6,518,130 B1 | 2/2003 | Ohno | |
| 6,613,657 B1 | 9/2003 | Ngo et al. | |
| 6,703,669 B1 | 3/2004 | Goda et al. | |
| 6,740,605 B1 | 5/2004 | Shiraiwa et al. | |
| 7,221,586 B2 * | 5/2007 | Forbes et al. | 365/185.05 |
| 7,554,161 B2 * | 6/2009 | Ahn et al. | 257/368 |
| 8,319,266 B1 | 11/2012 | Kinoshita et al. | |
| 2004/0094793 A1 | 5/2004 | Noguchi et al. | |
| 2013/0078795 A1 | 3/2013 | Kinoshita et al. | |

OTHER PUBLICATIONS

Co-pending U.S. Appl. No. 11/109,179, file Apr. 20, 2005, entitled "Void Free Interlayer Dielectric", by Minh Van Ngo et al., 32 pages.

* cited by examiner

*Primary Examiner* — Theresa T Doan
(74) *Attorney, Agent, or Firm* — Harrity & Harrity, LLP

(57) ABSTRACT

A method of manufacturing a non-volatile memory device includes forming a number of memory cells. The method also includes depositing a first dielectric layer over the memory cells, where the first dielectric layer is a conformal layer having a substantially uniform thickness. The method further includes depositing a second dielectric layer over the first dielectric layer. Together, the first and second dielectric layers form an interlayer dielectric without voids.

20 Claims, 13 Drawing Sheets

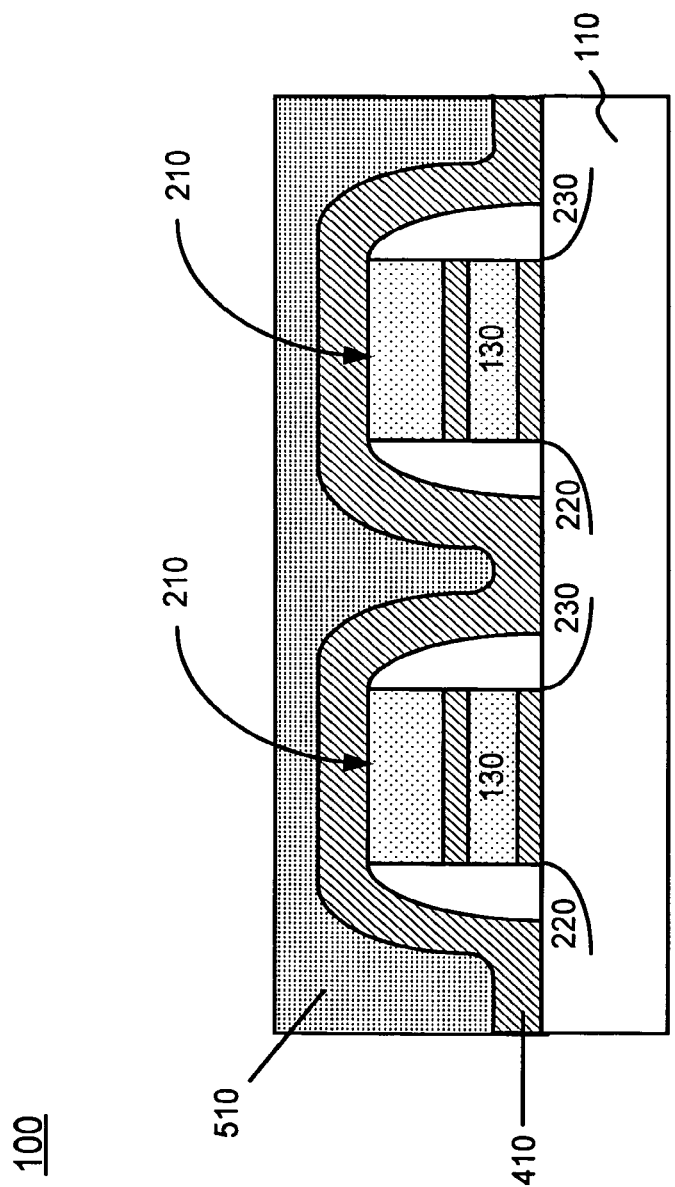

VOID FREE INTERLAYER DIELECTRIC

RELATED APPLICATION

This application is a continuation of U.S. patent application Ser. No. 11/109,719, filed Apr. 20, 2005, the entire content of which is hereby incorporated by reference.

TECHNICAL FIELD

The present invention relates generally to semiconductor devices and methods of manufacturing semiconductor devices. The invention has particular applicability to memory devices and forming void fee interlayer dielectrics.

BACKGROUND ART

The escalating demands for high density and performance associated with non-volatile memory devices require small design features, high reliability and increased manufacturing throughput. The reduction of design features, however, challenges the limitations of conventional methodology. For example, the reduction of design features makes it difficult for the memory device to meet its expected data retention requirement.

In addition, various processes that are used to complete the formation of a working memory device, such as an electrically erasable programmable read only memory (EEPROM) device, often create problems associated with the operation of the memory device. For example, it is often difficult to deposit an interlayer dielectric that fills all the space between adjacent memory cells. This often leads to gaps or voids in the interlayer dielectric. Such gaps or voids in the interlayer dielectric may lead to charge leakage problems associated with memory cells in the memory device. These voids may also make it difficult to program and/or erase the memory device in an efficient manner and, ultimately, may lead to device failure.

DISCLOSURE OF THE INVENTION

According to one aspect consistent with the invention, a method of manufacturing a memory device is provided. The method includes forming a first dielectric layer over a substrate and forming a charge storage element over the first dielectric layer. The method also includes forming a second dielectric layer over the charge storage element and forming a control gate over the second dielectric layer. The method further includes depositing a first interlayer dielectric over the control gate and the substrate using an atomic layer deposition process.

According to another aspect consistent with the invention, a method of forming a semiconductor device includes forming a first dielectric layer over a substrate and forming a charge storage element over the first dielectric layer. The method also includes forming a second dielectric layer over the charge storage element and forming a control gate over the second dielectric layer. The method further includes depositing a first interlayer dielectric over the control gate and the substrate using a plasma enhanced chemical vapor deposition process.

According to a further aspect consistent with the invention, a method of manufacturing a non-volatile memory device includes forming a plurality of memory cells. The method also includes depositing a first dielectric layer over the plurality of memory cells, where the first dielectric layer is a conformal layer having a substantially uniform thickness.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 5B is a cross-section illustrating the planarization of the dielectric layer of FIG. 5A in accordance with an embodiment of the invention.

BEST MODE FOR CARRYING OUT THE INVENTION

Implementations consistent with the invention reduce problems in a memory device by depositing a conformal layer that may be part of an interlayer dielectric. The conformal layer helps reduce or eliminate voids in the interlayer dielectric.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

Figure 1:
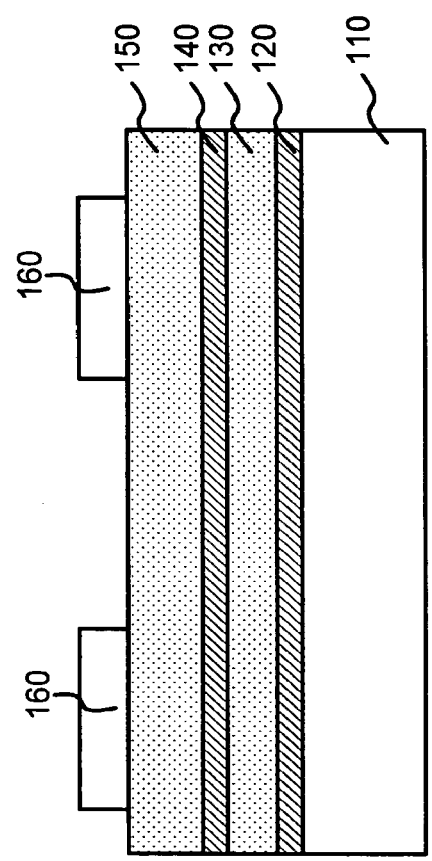
FIG. 1 is a cross-section illustrating exemplary layers used to form memory cells in accordance with an embodiment of the invention.

FIG. 1 illustrates the cross-section of a semiconductor device 100 formed in accordance with an embodiment of the invention. Referring to FIG. 1, semiconductor device 100 may include layers 110, 120, 130, 140 and 150. In an exemplary embodiment, layer 110 may be a substrate of semiconductor device 100 and may include silicon, germanium, silicon-germanium or other semiconducting materials. In alternative implementations, layer 110 may be a conductive layer or a dielectric layer formed a number of layers above the surface of a substrate in semiconductor device 100.

Layer 120 may be a dielectric layer formed on layer 110 in a conventional manner. In an exemplary implementation, dielectric layer 120 may include an oxide, such as a silicon oxide (e.g., $SiO_2$), and may have a thickness ranging from about 20 angstroms (Å) to about 120 Å. D*ielectric* layer 120 may function as a tunnel oxide layer for a subsequently formed memory cell of *semiconductor* device 100.

Layer 130 may be formed on layer 120 in a conventional manner and may include a conductive material, such as polycrystalline silicon. Layer 130, consistent with the invention, may act as a floating gate layer or charge storage element for semiconductor device 100 and may have a thickness ranging from about 20 Å to about 120 Å. In alternative implementations, layer 130 may include a dielectric material, such as a nitride (e.g., a silicon nitride) or an oxynitride, that acts as a charge storage layer for semiconductor device 100.

Layer 140 may be formed on layer 130 in a conventional manner and may include a dielectric material, such as an oxide (e.g., $SiO_2$). Alternatively, layer 140 may include a material having a high dielectric constant (K), such as aluminum oxide or hafnium oxide, that may be deposited or thermally grown on layer 130. In still other alternatives, layer 140 may be a composite that includes a number of dielectric layers or films, such as an oxide-nitride-oxide stack. Layer 140 may have a thickness ranging from about 20 Å to about 120 Å and may function as an inter-gate dielectric for memory cells in semiconductor device 100.

Layer 150 may include a conductive material, such as polycrystalline silicon, formed on layer 140 in a conventional manner. Alternatively, layer 150 may include other semiconducting materials, such as germanium or silicon-germanium, or various metals, such as titanium or tungsten. Layer 150, consistent with the invention, may be used to form one or more control gate electrodes for one or more memory cells in semiconductor device 100. In an exemplary implementation, layer 150 may have a thickness ranging from about 800 Å to about 2,500 Å. An optional silicide layer, such as titanium silicide (not shown) may be formed on layer 150.

A photoresist material may be patterned and etched to form masks 160 on the top surface of layer 150, as illustrated in FIG. 1. Masks 160 may be used to facilitate formation of one or memory cells in semiconductor device 100, as described in more detail below.

Figure 2:
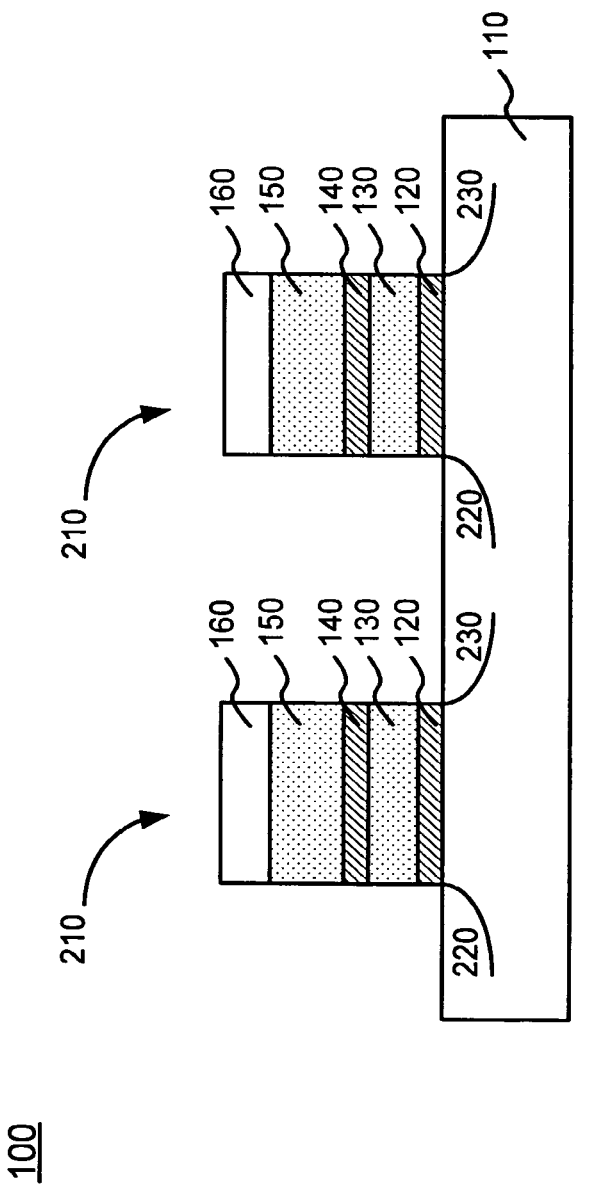
FIG. 2 is a cross-section illustrating the formation of memory cells in accordance with an embodiment of the invention.

Semiconductor device 100 may then be etched, as illustrated in FIG. 2. Referring to FIG. 2, layers 120-150 may be etched in a conventional manner with the etching terminating at substrate 110, thereby forming structures 210. Alternatively, the etching may terminate at an other layer, such as layer 140, followed in some implementations by additional etching, to form structures 210. Each structure 210 (also referred to herein as a memory cell 210) may represent a memory cell of semiconductor device 100, where each memory cell 210 includes a dielectric layer 120, a floating gate or charge storage layer 130, an inter-gate dielectric layer 140 and a control gate 150. Only two memory cells 210 are illustrated in semiconductor device 100 in FIG. 2 for simplicity. It should be understood that semiconductor device 100 may typically include a memory array including a large number of memory cells 210.

Source and drain regions 220 and 230 may be formed in substrate 110, as illustrated in FIG. 2. For example, n-type or p-type impurities may be implanted in substrate 110 to form source and drain regions 220 and 230, based on the particular end device requirements. The particular implantation dosages and energy used to form source and drain regions 220 and 230 may be selected based on the particular end device requirements. One of ordinary skill in the art would be able to optimize the source/drain implantation process based on the particular circuit requirements. It should also be understood that source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

Figure 3:
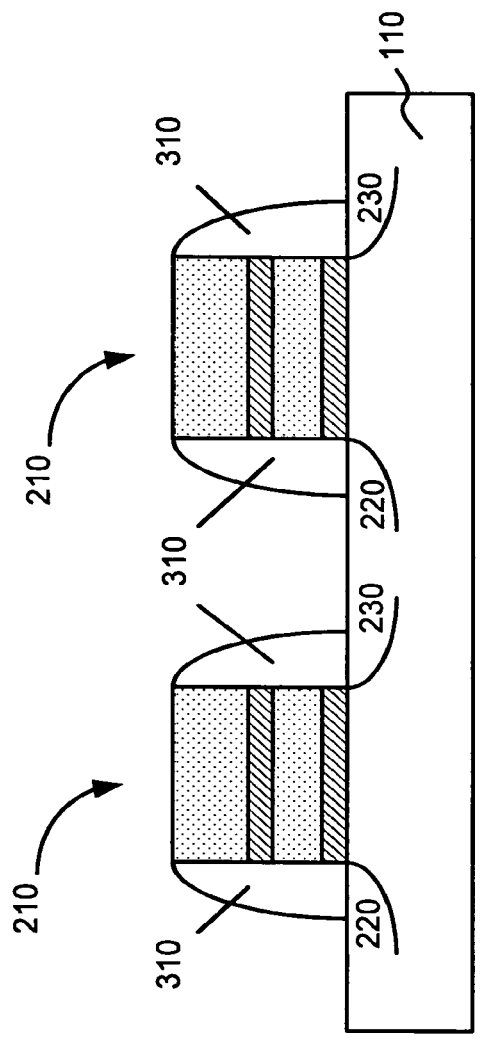
FIG. 3 is a cross-section illustrating the formation of spacers on the device of FIG. 2 in accordance with an embodiment of the invention.

Photoresist masks 160 may be removed using a conventional process. Spacers 310 may be formed adjacent the sidewalls of the memory cells 210, as illustrated in FIG. 3. For example, a dielectric material, such as a silicon oxide, a silicon nitride, a silicon oxynitride or another dielectric material, may be deposited and etched to form spacers 310 on each side of memory cells 210, as illustrated in FIG. 3. Spacers 310 may be used to electrically isolate adjacent memory cells 210 from each other. Spacers 310 may also be used to facilitate the deposition of impurities in semiconductor device 100.

Figure 4:
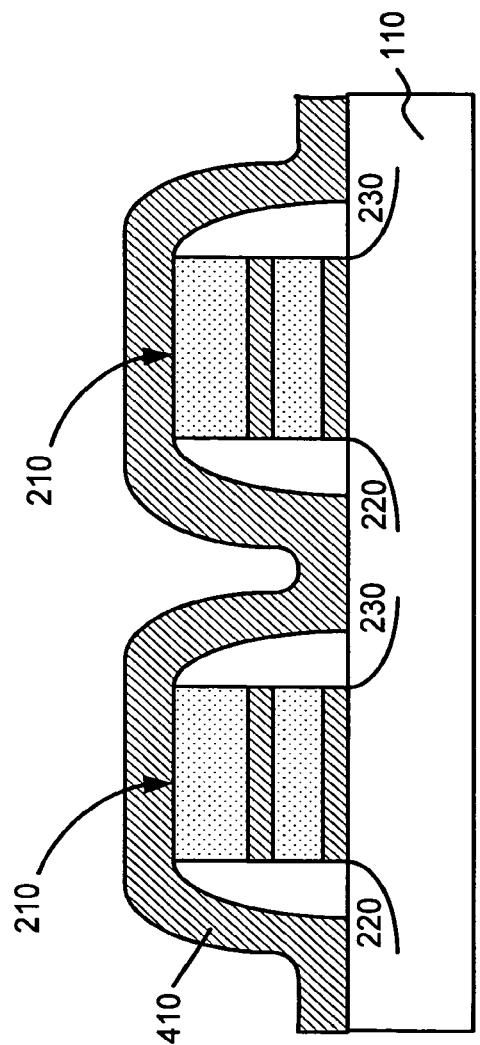
FIG. 4 is a cross-section illustrating the formation of a conformal dielectric layer on the device of FIG. 3 in accordance with an embodiment of the invention.

A dielectric layer 410 may then be deposited over semiconductor device 100, as illustrated in FIG. 4. In an exemplary embodiment, dielectric layer 410 may include a silicon nitride material (e.g., $Si_3N_4$) deposited using an atomic layer deposition (ALD) process. In alternative implementations, dielectric layer 410 may include other materials, such as a silicon oxynitride (SiON), silicon dioxide and/or some combination of these materials, deposited via an ALD process. Dielectric layer 410, consistent with the invention, may be deposited to a thickness ranging from about 50 Å to about 500 Å. It has been found that depositing dielectric layer 410 using an ALD process to the thickness discussed above results in better conformality for dielectric layer 410, as compared to depositing dielectric layer 410 using, for example, a conventional chemical vapor deposition (CVD) process. That is, dielectric layer 410, deposited via an ALD process, forms a liner layer over memory cells 210 and substrate 110 to a substantially uniform thickness. The ALD process advantageously enables dielectric layer 410 to fill small holes between memory cells 210, even when memory cells 210 have a high aspect ratio.

The resulting conformality of dielectric layer 410 also prevents re-entrant angles associated with dielectric layer 410. For example, in conventional depositions of a dielectric layer, such as $Si_3N_4$, the dielectric layer may form sharp angles at various locations, such as over spacers 310, that slope inward toward memory cells 210. These re-entrant angles often make it difficult or impossible to deposit a subsequent dielectric that completely fills all the spaces between adjacent memory cells 210, thereby leading to voids. As illustrated in FIG. 4, dielectric layer 410 forms a conformal layer that provides a good liner for the deposition of a subsequently deposited dielectric layer that enables the subsequently deposited dielectric layer to fill all the spaces between adjacent memory cells 210, as described in more detail below.

In an alternative embodiment, dielectric layer 410 may be deposited using a plasma enhanced chemical vapor deposition (PECVD) process. In this embodiment, a silicon nitride (e.g., $Si_3N_4$) may be deposited using high flow rates of, for example, $NH_3$. For example, to deposit dielectric layer 410 having a thickness ranging from about 50 Å to about 500 Å, $NH_3$ may be provided to a PECVD chamber at a flow rate greater than about 10,000 standard cubic centimeters per minute (sccm). In one exemplary embodiment, $NH_3$ may be provided at a flow rate ranging from about 8,000 sccm to about 15,000 sccm for a period ranging from about 5 seconds to about 50 seconds. These flow rates are higher than those typically used to deposit a silicon nitride.

In addition, the PECVD chamber may be supplied with a higher power than that typically used when depositing a silicon nitride. For example, in an exemplary embodiment consistent with the invention, radio frequency (RF) power of greater than 800 watts may be supplied to the PECVD chamber. In one exemplary implementation, the PECVD chamber used in accordance with the invention may utilize dual RF power sources. In this implementation, each of the RF power sources may be set to provide power ranging from about 500 watts to about 1,000 watts. Alternatively, a single RF power source may be set to provide power ranging from about 700 watts to about 1,500 watts to the PECVD chamber.

The flow rates and power ranges discussed above are higher than the flow rates/power ranges normally used to deposit silicon nitride. It has been found that depositing silicon nitride using such high $NH_3$ flow rates and high RF power ranges results in better conformality for dielectric layer 410, as opposed to a conventional CVD process used to deposit a silicon nitride layer. In addition, depositing dielectric layer 410 using these flow rates/power ranges advantageously prevents re-entrant angles associated with dielectric layer 410 from forming. It should be understood that the flow rates/power ranges described above for depositing a silicon nitride layer are exemplary only. One of ordinary skill in the art would be able to optimize the flow rates and power ranges given the guidance disclosed herein.

In the embodiments described above, (i.e., depositing dielectric layer 410 using an ALD process or depositing dielectric layer 410 using a PECVD process using high flow rates/high RF power), it has been found that forming a conformal dielectric layer 410 enables layer 410 to fill small gaps and spaces between memory cells 210 even when memory cells 210 have a high aspect ratio. In addition, dielectric layer 410 formed in accordance with the embodiments described above acts as a good liner for a subsequently deposited dielectric material. In this manner, dielectric layer 410 and the subsequently deposited dielectric material are able to form an interlayer dielectric (ILD) that is free of voids, as described in more detail below.

Figure 5A:
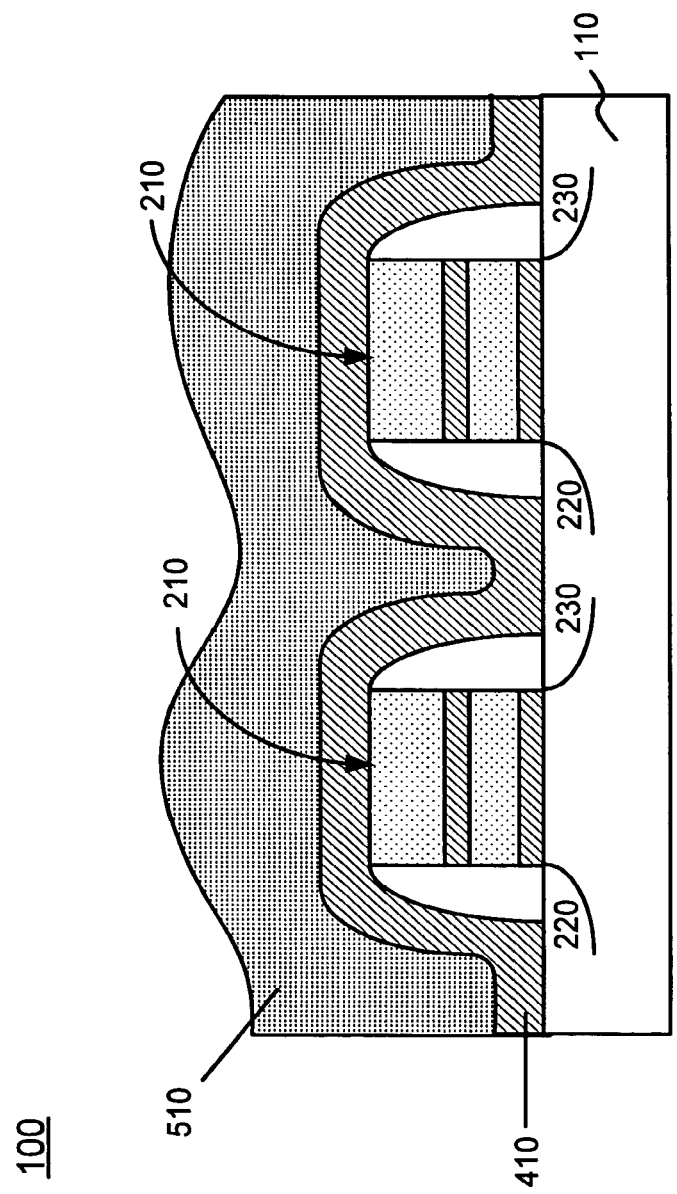
FIG. 5A is a cross-section illustrating the formation of a dielectric layer on the device of FIG. 4 in accordance with an embodiment of the invention.

An ILD 510 may be formed on dielectric layer 410, as illustrated in FIG. 5A. In an exemplary implementation, ILD 510 may include a boro-phosphosilicate glass (BPSG) material. Alternatively, ILD 510 may include a phosphosilicate glass (PSG) material, an oxide or some other dielectric material. The thickness of ILD 510 may range from about 2,000 Å to about 11,000 Å.

As a result of the conformal nature of dielectric layer 410 and the fact that no re-entrant angles are formed in dielectric layer 410, ILD 510 may completely fill all the spaces between adjacent memory cells 210. This eliminates voids in ILD 510 and prevents subsequent problems associated with voids.

ILD 510 may optionally be planarized using a conventional process, such as a chemical-mechanical polishing (CMP) process, as illustrated in FIG. 5B. Referring to FIG. 5B, the CMP process may planarize the top surface of ILD 510 to facilitate formation of subsequent structures, such as interconnect lines. Dielectric layer 410 and ILD 510, consistent with the invention, may represent an ILD located closest to substrate 110. In alternative implementations, dielectric layer 410 and ILD 510 may represent an interlayer dielectric formed a number of layers above the surface of substrate 110. In each case, dielectric layer 410 and ILD 510 function as an ILD to isolate various conductive structures, such as various interconnect lines described below or to isolate source region 220 or drain region 230 from other conductive structures.

Figure 6A:
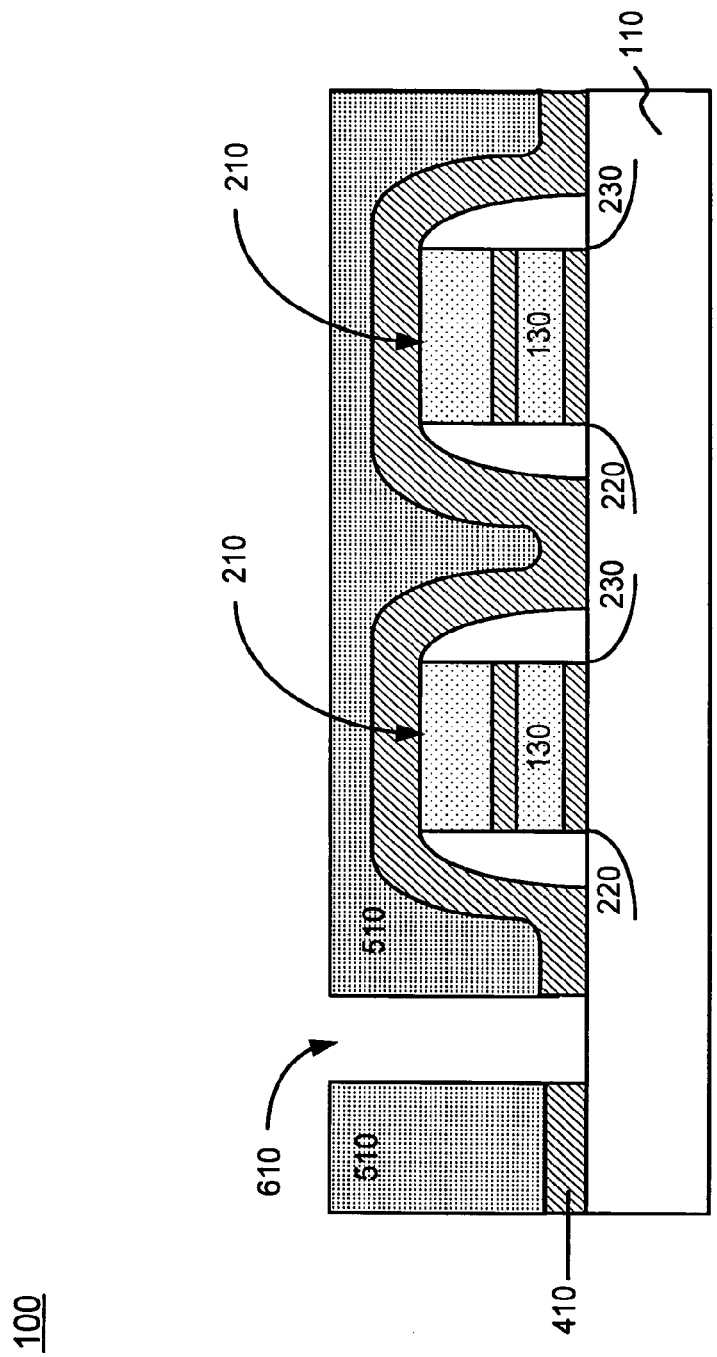
FIGS. 6A and 6B are cross-sections illustrating the formation of a contact in the interlayer dielectric of FIG. 5B in accordance with an embodiment of the invention.
Figure 6B:
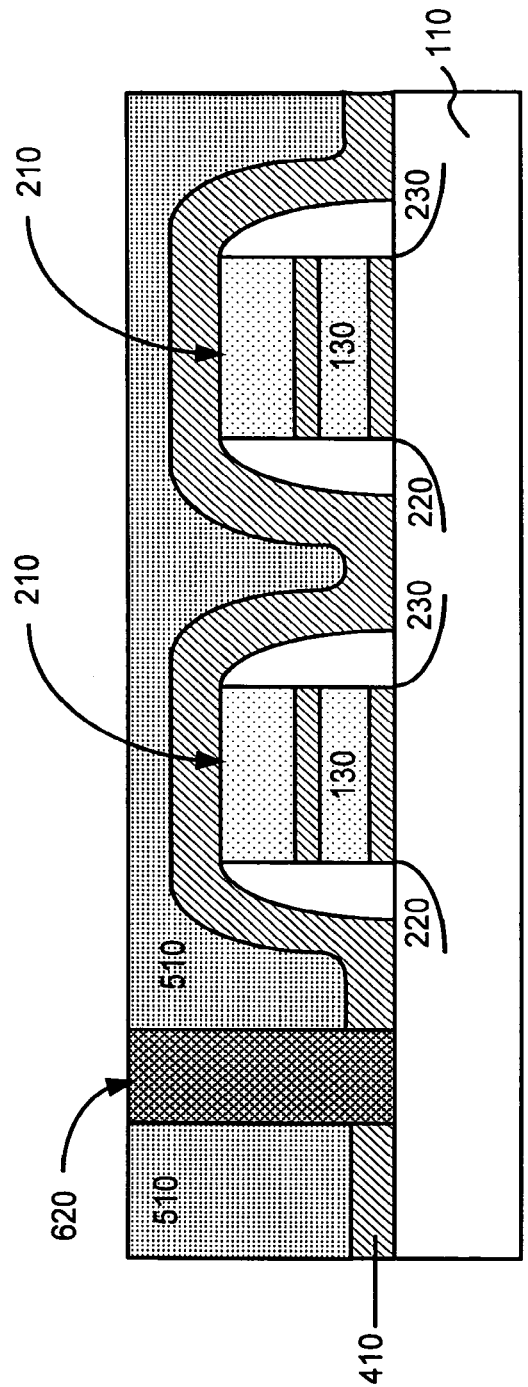

A contact hole 610 may be formed in ILD 510 and dielectric layer 410 using conventional photolithographic and etching techniques, as illustrated in FIG. 6A. Contact hole 610 may be used to form a contact to source region 220 or drain region 230. Next, a metal layer 620, such as tungsten, copper or aluminum, may be deposited to fill contact hole 610, as illustrated in FIG. 6B. Metal layer 620 may represent a contact to, for example, source region 220.

Figure 7:
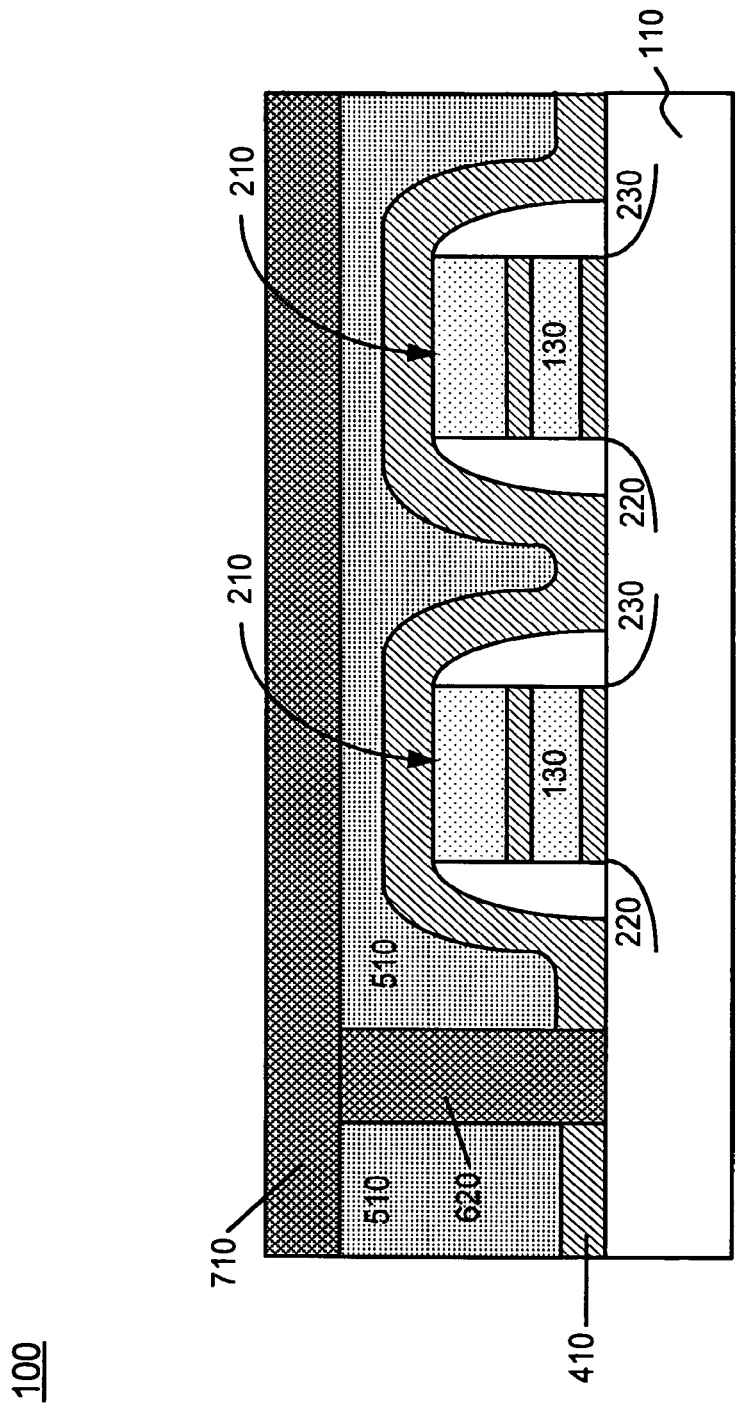
FIG. 7 is a cross-section illustrating the formation of a conductive interconnect on the device of FIG. 6B in accordance with an embodiment of the invention.

A conductive interconnect line 710 may then be formed over the planarized top surface of ILD 510, as illustrated in FIG. 7. For example, a metal, such as tungsten, copper or aluminum, may be deposited to form conductive line 710 that connects various features in semiconductor device 100, such as source or drain regions 220/230 through contact 620 to an external electrode (not shown). Alternatively, conductive line 710 may connect various memory cells 210 in semiconductor device 100. Conductive line 710 may facilitate programming or erasing various memory cells 210 in semiconductor device 100.

Figure 8:
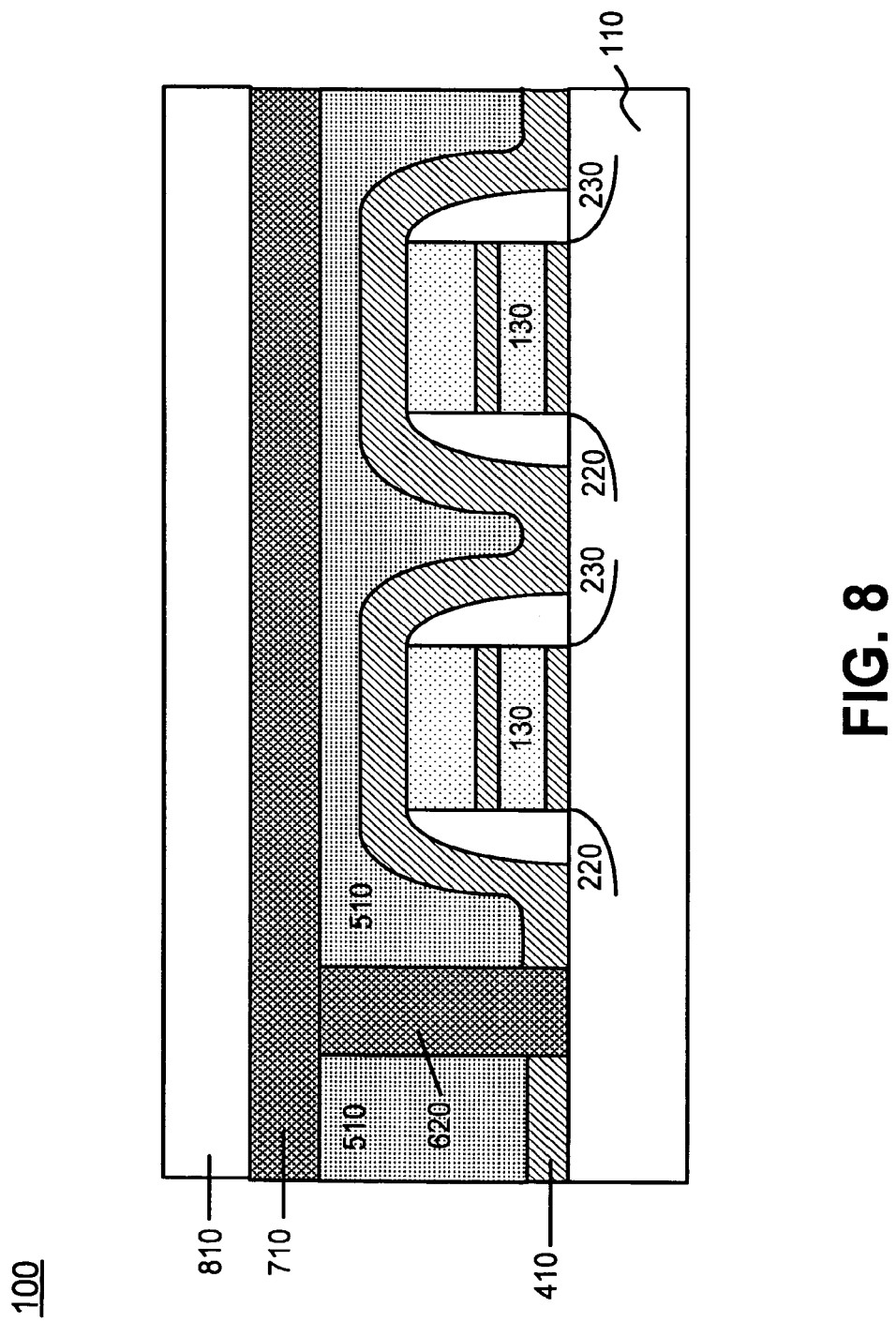
FIG. 8 is a cross-section illustrating the formation of an interlayer layer dielectric on the device of FIG. 7 in accordance with an embodiment of the invention.

An ILD 810 may be formed over conductive line 710, as illustrated in FIG. 8. In an exemplary implementation, ILD 810 may include a PSG material, a fluorine doped silicate glass (FSG) material, an oxide, a nitride or some other dielectric material. The thickness of ILD 810 may range from about 1,500 Å to about 3,500 Å. In some implementations, an ILD liner may be formed prior to the formation of ILD 810.

Figure 9:
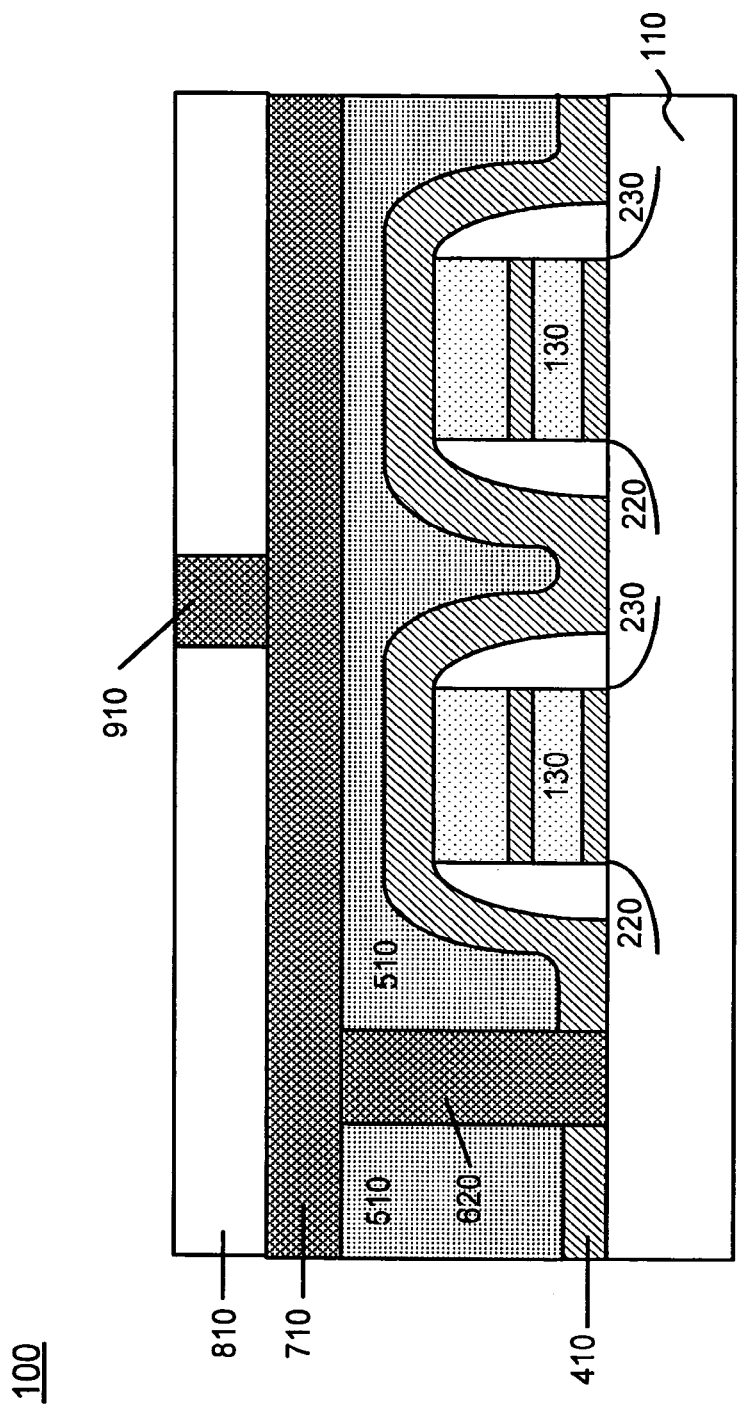
FIG. 9 is a cross-section illustrating the formation of a contact in the interlayer dielectric of FIG. 8 in accordance with an embodiment of the invention.

Various back end of line (BEOL) processing may be performed to complete the fabrication of semiconductor device 100. For example, a contact hole/trench may be formed in ILD 810 followed by deposition of a metal layer 910, such as tungsten, copper or aluminum, as illustrated in FIG. 9. Metal layer 910 may represent a contact to an uppermost conductive layer of semiconductor device 100. Alternatively, metal layer 910 may represent a contact to any one of a number of conductive layers in semiconductor device 100.

Figure 10:
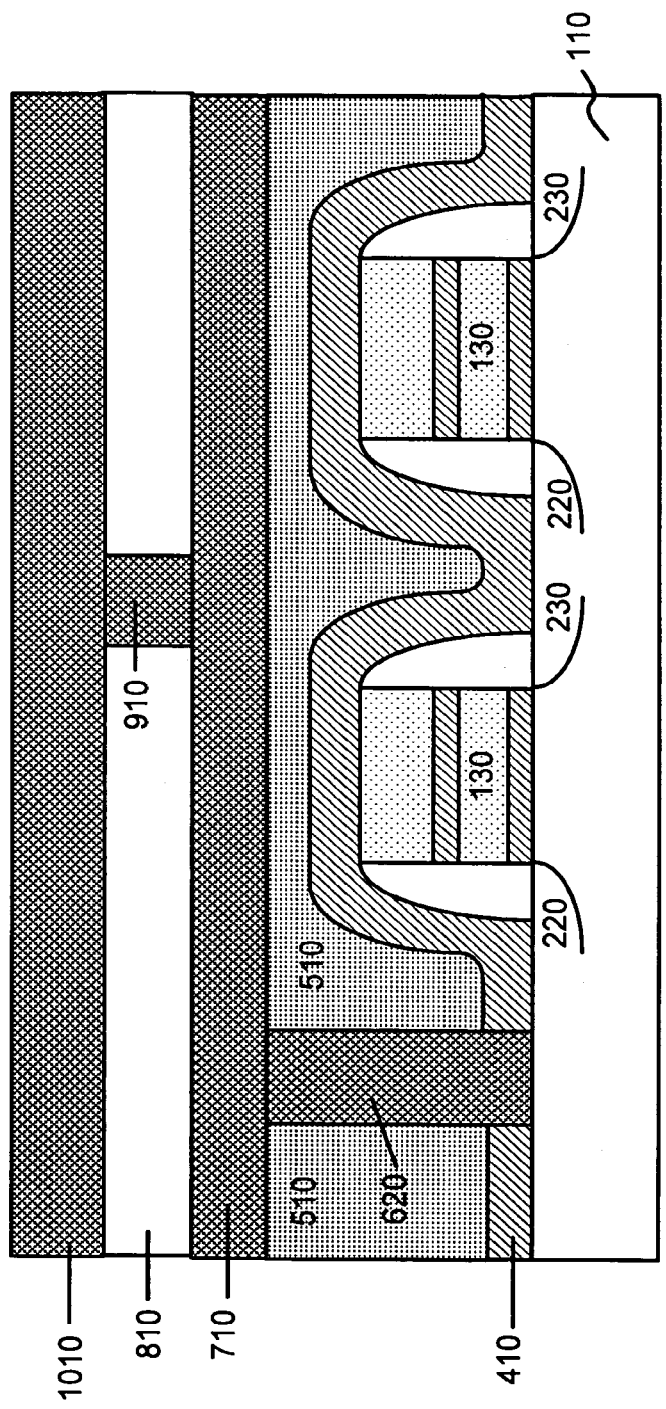
FIG. 10 is a cross-section illustrating the formation of a conductive layer on the device of FIG. 9 in accordance with an embodiment of the invention.

A conductive layer may then be formed over ILD 810. For example, a metal, such as tungsten, copper or aluminum, may be deposited to form conductive line 1010, as illustrated in FIG. 10. Conductive line 1010 may represent a BEOL structure or connector that connects various features in semiconductor device 100, such as source or drain regions 220/230 to an external electrode (not shown), to facilitate programming or erasing of various memory cells 210 in semiconductor device 100.

A top dielectric layer 1110, also referred to as cap layer 1110, may be formed over conductive line 1010. In an exemplary embodiment, cap layer 1110 may be deposited to a thickness ranging from about 6,000 Å to about 10,000 Å. Cap layer 1110 may act as a protective layer to prevent damage to conductive line 1010 and other portions of semiconductor device 100 during subsequent processing. For example, cap layer 1110 may protect semiconductor device 100 against impurity contamination during subsequent cleaning processes that may be used to complete a working memory device.

Figure 11:
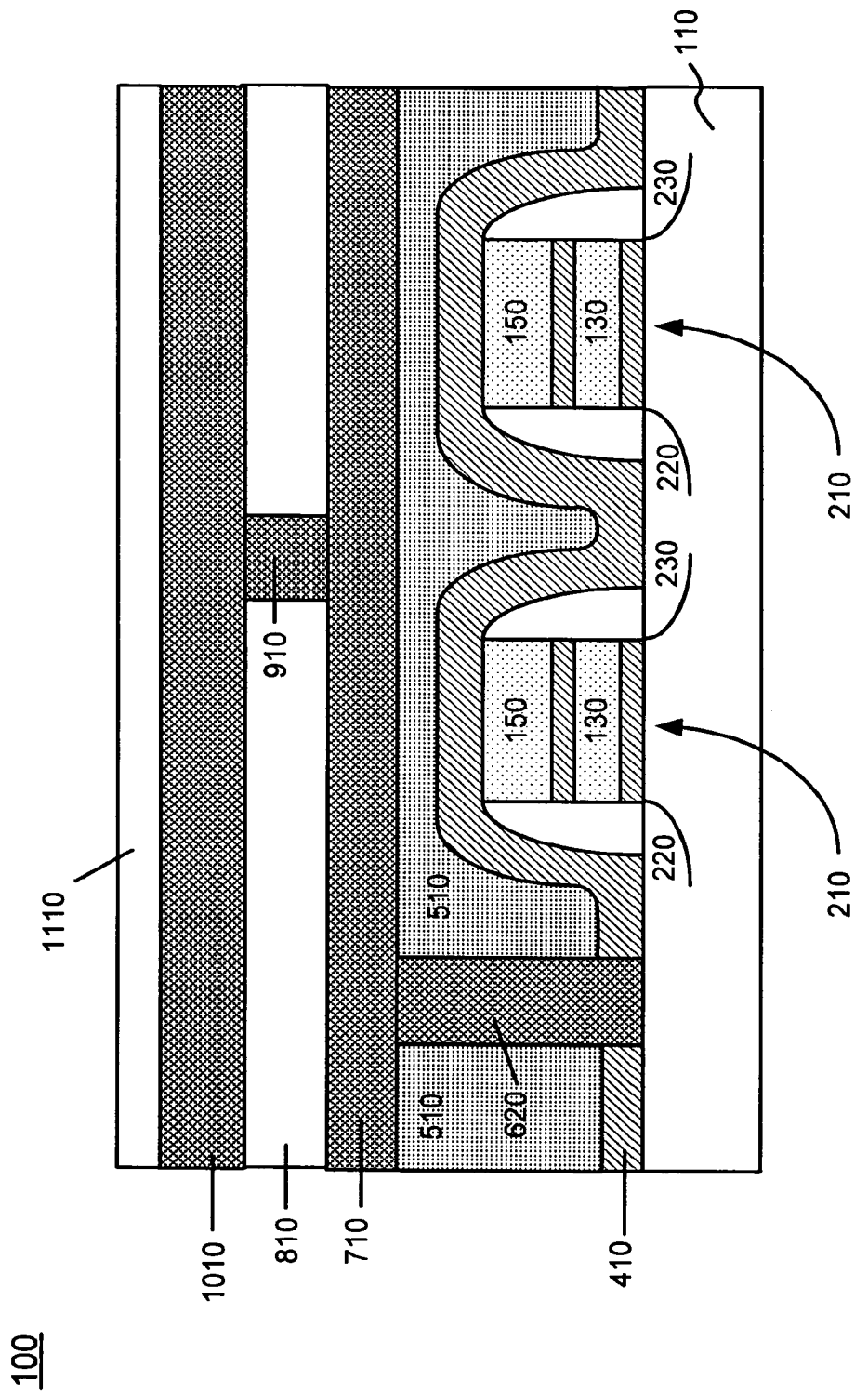
FIG. 11 is a cross-section illustrating the formation of a dielectric layer on the device of FIG. 10 in accordance with an embodiment of the invention.

While only two ILDs (i.e., ILD 410/510 and ILD 810) and two conductive layers (i.e., layers 710 and 1010) are illustrated in FIG. 11 for simplicity, it should be understood that semiconductor device 100 may include more ILD layers and conductive layers based on the particular circuit requirements.

Each memory cell 210 in semiconductor device 100 may be an EEPROM type memory device and one or more programming circuits (not shown) may be used to facilitate programming and erasing of one or more memory cells 210 of semiconductor device 100. Programming of memory cells 210 may be accomplished by applying a predetermined voltage to control gate 150. Once programmed, electrons remain stored in layer 130 until an erase procedure is performed.

As described above with respect to FIG. 1, in an exemplary embodiment consistent with the invention, semiconductor device 100 may be a floating gate memory device in which layer 130 may include a conductive material, such as polycrystalline silicon. In another exemplary embodiment described above with respect to FIG. 1, layer 130 may include a dielectric material, such as a silicon nitride. In this embodiment, semiconductor device 100 illustrated in FIG. 11 may be a SONOS type memory device with a silicon control gate 150 formed on an oxide-nitride-oxide (ONO) stack (layers 140, 130, 130), with nitride layer 130 acting as the charge storage layer, and the ONO stack being formed on a silicon substrate 110.

Further, in an exemplary implementation in which semiconductor device is a SONOS type memory device, each of memory cells 210 illustrated in FIG. 11 may be configured to store two bits of data. That is, charge storage layer 130 may be programmed to store charges representing two separate bits of data by localizing the first and second charges to the respective left and right sides of charge storage layer 130 illustrated in FIG. 11. Each of the two bits of memory cell 210 may be programmed independently by, for example, channel hot electron injection, to store charges representing a bit on each respective side of the charge storage layer 130. In this manner, the charges in charge storage layer 130 become effectively trapped on each respective side of charge storage layer 130. Erasing of each bit in memory cell 210 may also be performed independently. During erasing, the charges stored in charge storage layer 130 may tunnel through dielectric layer 120 into source region 220 and drain region 230, respectively. In this implementation, the density of the array of memory cells 210 in semiconductor device 100 may be increased as compared to conventional memory devices that store only one bit of data per cell.

In summary, implementations consistent with the invention form an ILD using a conformal layer that acts as a liner layer for the subsequently deposited dielectric layer. Together, the conformal layer (i.e., dielectric layer 410) and the dielectric layer formed on the conformal layer (i.e., ILD 510) form an ILD. Advantageously, the ILD may be formed without voids or gaps. Memory cells 210 may therefore exhibit increased reliability and may be efficiently programmed and/or erased.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of CVD processes, including PECVD and low pressure chemical vapor deposition (LPCVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A memory device comprising:
   a plurality of memory cells formed on a substrate of the memory device;
   a dielectric layer deposited over a control gate of each memory cell, of the plurality of memory cells, and the substrate,
     the dielectric layer being deposited using an atomic layer deposition process,
       the dielectric layer, deposited using the atomic layer deposition process, filling spaces between adjacent memory cells of the plurality of memory cells, and
       the dielectric layer, deposited using the atomic layer deposition process, having a substantially uniform thickness that prevents re-entrant angles; and
   an interlayer dielectric deposited over the dielectric layer,
     the interlayer dielectric being deposited to fill, based on the substantially uniform thickness that prevents the re-entrant angles, the spaces between the adjacent memory cells,
     voids, in the interlayer dielectric, being eliminated based on the interlayer dielectric being deposited to fill the spaces between the adjacent memory cells.

2. The device of claim 1, where the dielectric layer comprises a silicon nitride.

3. The device of claim 1, where the dielectric layer comprises silicon dioxide.

4. The device of claim 1, where the interlayer dielectric is deposited to a thickness ranging from about 2,000 Å to about 11,000 Å.

5. The device of claim 1, where the dielectric layer acts as a liner for the interlayer dielectric.

6. The device of claim 1, where the dielectric layer contacts at least a portion of the substrate.

7. The device of claim 1, where the dielectric layer is deposited, using the atomic layer deposition process, to a thickness ranging from about 50 Å to about 500 Å.

8. The device of claim 1, where the interlayer dielectric comprises:
   a boro-phosphosilicate glass, or
   a phosphosilicate glass material.

9. A device comprising:
a plurality of memory cells formed on a substrate of the device;
a dielectric layer deposited over the plurality of memory cells and over the substrate,
the dielectric layer being deposited using an atomic layer deposition process,
the dielectric layer, deposited using the atomic layer deposition process, filling spaces between adjacent memory cells of the plurality of memory cells, and
the dielectric layer, deposited using the atomic layer deposition process, having a substantially uniform thickness that prevents re-entrant angles; and
an interlayer dielectric deposited over the dielectric layer,
the interlayer dielectric being deposited to fill, based on the substantially uniform thickness that prevents the re-entrant angles, the spaces between the adjacent memory cells,
voids, in the interlayer dielectric, being eliminated based on the interlayer dielectric being deposited to fill the spaces between the adjacent memory cells.

10. The device of claim 9, where the interlayer dielectric comprises:
a boro-phosphosilicate glass material, or
a phosphosilicate glass material.

11. The device of claim 9, where the dielectric layer comprises silicon dioxide.

12. The device of claim 9, where the interlayer dielectric is deposited to a thickness that ranges from about 2,000 Å to about 11,000 Å.

13. The device of claim 12, where the dielectric layer is deposited, using the atomic layer deposition process, to a thickness that ranges from about 50 Å to about 500 Å.

14. The device of claim 9, where the dielectric layer comprises a silicon nitride.

15. The device of claim 9, where the dielectric layer is deposited over a control gate of each memory cell of the plurality of memory cells.

16. A semiconductor device comprising:
a first memory cell and a second memory cell,
the first memory cell and the second memory cell being adjacent memory cells;
a dielectric layer deposited over the first memory cell and the second memory cell,
the dielectric layer being deposited using a deposition process,
the dielectric layer, deposited using the deposition process, filling spaces between the first memory cell and the second memory cell, and
the dielectric layer, deposited using the deposition process, having a substantially uniform thickness that prevents re-entrant angles; and
an interlayer dielectric deposited over the dielectric layer,
the interlayer dielectric being deposited to fill, based on the substantially uniform thickness that prevents the re-entrant angles, the spaces between the first memory cell and the second memory cell,
voids, in the interlayer dielectric, being eliminated based on the interlayer dielectric being deposited to fill the spaces between the first memory cell and the second memory cell.

17. The semiconductor device of claim 16, where the dielectric layer deposited using the deposition process includes:
a silicon nitride deposited at a flow rate,
the flow rate ranging from about 8,000 standard cubic centimeters per minute to about 15,000 standard cubic centimeters per minute.

18. The semiconductor device of claim 17, where the dielectric layer deposited using the deposition process further includes:
the silicon nitride deposited further using radio frequency power of one or more radio frequency sources,
the radio frequency power ranging from about 700 watts to about 1,500 watts.

19. The semiconductor device of claim 18, where the flow rate is greater than about 10,000 standard cubic centimeters per minute, and
where the radio frequency power is greater than 800 watts.

20. The semiconductor device of claim 16, where the interlayer dielectric comprises:
a boro-phosphosilicate glass material, or
a phosphosilicate glass material, and
where the interlayer dielectric is deposited to a thickness that ranges from about 2,000 Å to about 11,000 Å.

* * * * *